(12) United States Patent
Harder

(10) Patent No.: US 12,074,234 B1
(45) Date of Patent: Aug. 27, 2024

(54) SOLAR CELL WITH CELL ARCHITECTURE DESIGNED FOR REDUCED CARRIER RECOMBINATION

(71) Applicant: Maxeon Solar Pte. Ltd., Singapore (SG)

(72) Inventor: Nils Peter Harder, Pantin (FR)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/141,457

(22) Filed: Apr. 30, 2023

Related U.S. Application Data

(63) Continuation of application No. 18/123,318, filed on Mar. 19, 2023.

(51) Int. Cl.
    *H01L 31/0224* (2006.01)
    *H01L 31/02* (2006.01)
    *H01L 31/068* (2012.01)

(52) U.S. Cl.
    CPC ........... *H01L 31/022458* (2013.01); *H01L 31/02013* (2013.01); *H01L 31/0682* (2013.01)

(58) Field of Classification Search
    CPC ........... H01L 31/022441; H01L 31/068; H01L 31/182; H01L 31/022458; H01L 31/0682; H01L 31/02013
    See application file for complete search history.

(56) References Cited

U.S. PATENT DOCUMENTS

2012/0266951 A1\* 10/2012 Li ................. H01L 31/022441
                                                257/E31.13

FOREIGN PATENT DOCUMENTS

WO    WO-2023110534 A1 \* 6/2023 ......... H01L 27/1421

\* cited by examiner

*Primary Examiner* — Devina Pillay
(74) *Attorney, Agent, or Firm* — Vanguard/IP LLP; Reginald Ratliff

(57) ABSTRACT

A solar cell is disclosed. The solar cell incudes a substrate, a dielectric layer formed on a backside of the substrate, and a plurality of non-contiguous deposited emitter regions having a first polarity on the dielectric layer. The solar cell also includes at least one deposited emitter region having a second polarity on the dielectric layer, laterally disposed to the plurality of non-contiguous deposited emitter regions.

18 Claims, 5 Drawing Sheets

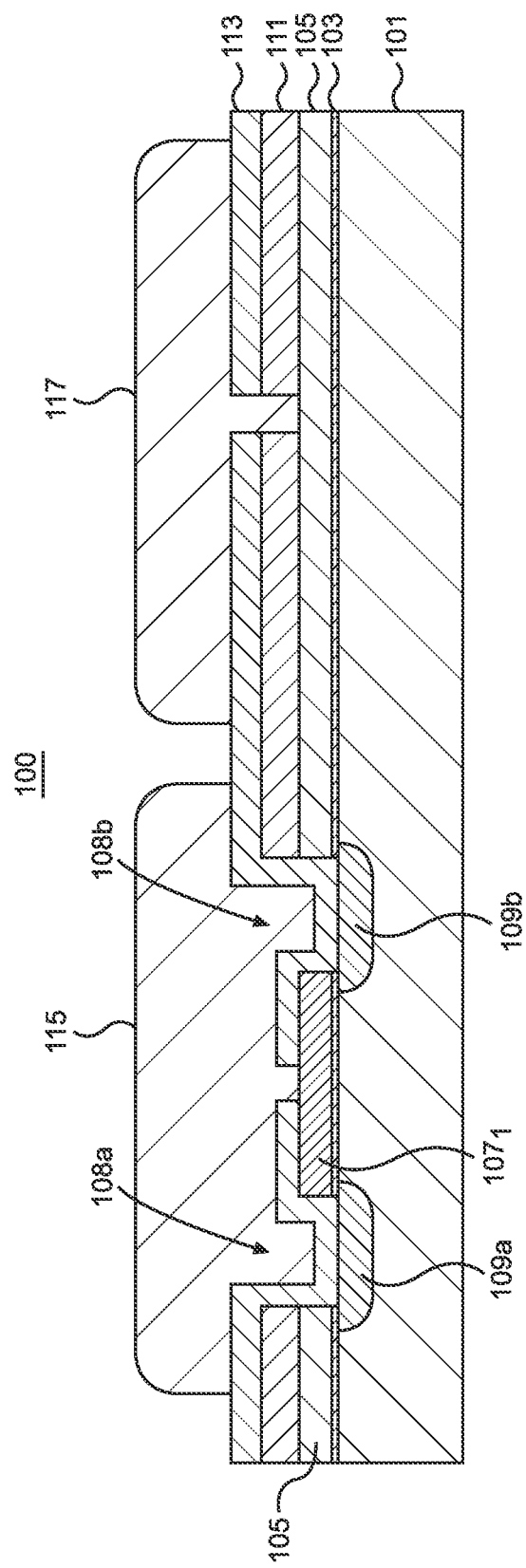
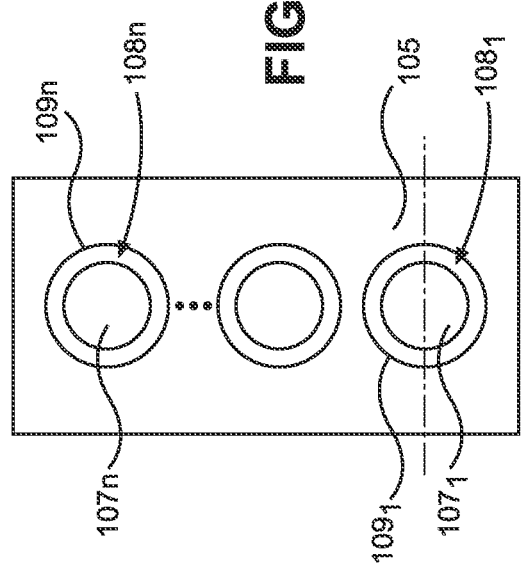

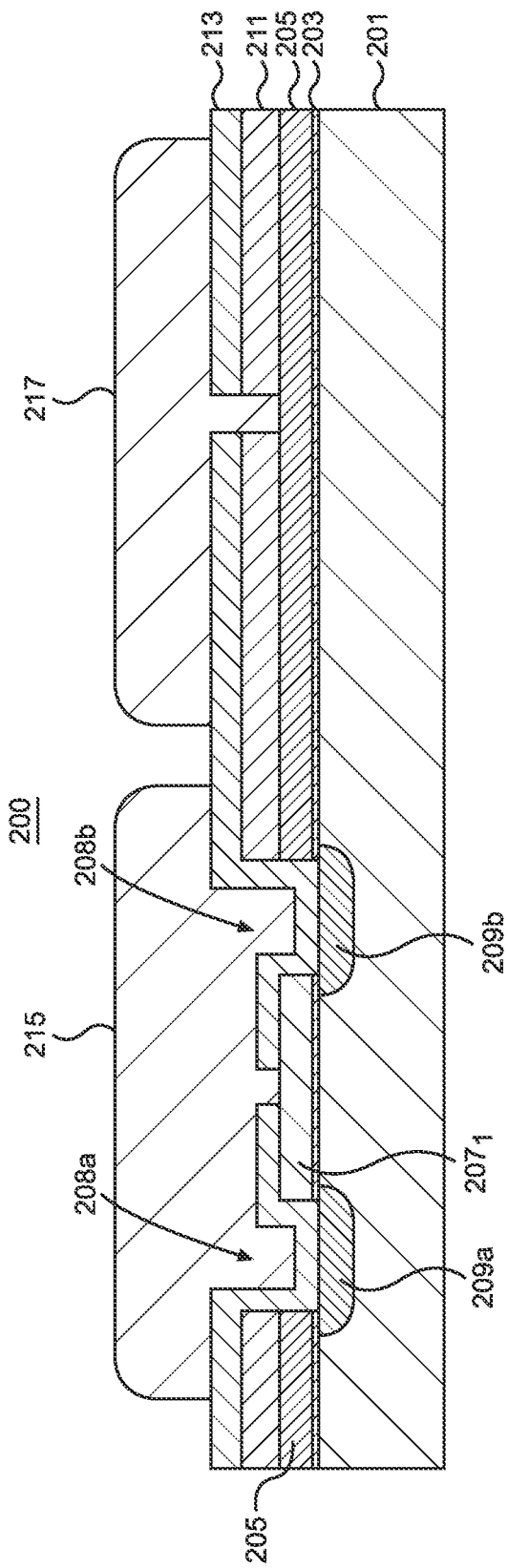
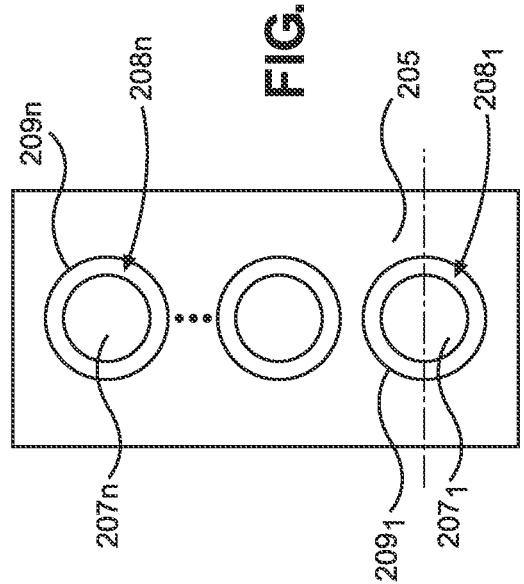

SOLAR CELL WITH CELL ARCHITECTURE DESIGNED FOR REDUCED CARRIER RECOMBINATION

CROSS-REFERENCE TO RELATED APPLICATION

This application is a continuation of U.S. patent application Ser. No. 18/123,318, filed Mar. 19, 2023, which is incorporated by reference herein in its entirety.

TECHNICAL FIELD

Embodiments of the disclosure pertain to solar cells and, in particular, to solar cells with cell architecture designed for reduced carrier recombination.

BACKGROUND

Solar cells are devices for converting solar radiation to electrical energy. They may be fabricated on a semiconductor wafer using semiconductor processing technology. A solar cell includes p-type and n-type doped regions. Solar radiation impinging on the solar cell creates electrons and holes that migrate to the doped regions and create voltage differentials between them that generate electrical current. In a backside contact solar cell, both doped regions and metal contacts are located on the backside of the solar cell. The metal contacts allow external electric circuits to be coupled to and powered by the solar cell. Efficiency is an important characteristic of solar cells that is related to their capacity to generate power. However, there are significant challenges related to the design and fabrication of solar cells with improved efficiency.

BRIEF DESCRIPTION OF THE DRAWINGS

FIG. 1A shows a cross-section of a portion of a solar cell according to one embodiment.

FIG. 1B illustrates an exemplary positioning of a plurality of circular trenches around a plurality of polysilicon structures in the solar cell of FIG. 1A according to one embodiment.

FIG. 2A shows a cross-section of a portion of a solar cell according to one embodiment.

FIG. 2B illustrates the positions of a plurality of circular trenches around a plurality of polysilicon structures in the solar cell of FIG. 2A according to one embodiment.

DESCRIPTION OF THE EMBODIMENTS

Figure 3A:
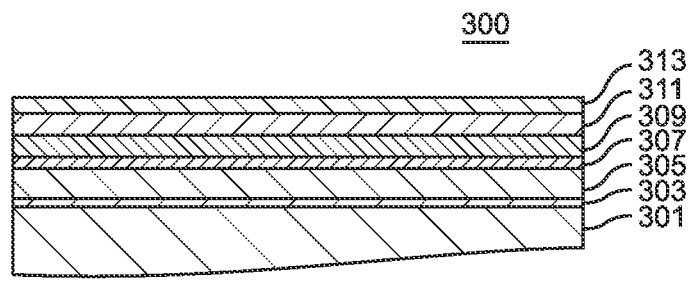
FIGS. 3A-3G are illustrations of cross-sections of a multilayer semiconductor structure during fabrication of a solar cell according to one embodiment.

Solar cells with cell architecture designed for reduced carrier recombination are described. It should be appreciated that although embodiments are described herein with reference to example solar cells with cell architecture designed for reduced carrier recombination, the disclosure is more generally applicable to solar cells with cell architecture designed for reduced carrier recombination as well as other type solar cells with cell architecture designed for reduced carrier recombination. In the following description, numerous specific details are set forth, in order to provide a thorough understanding of embodiments of the present disclosure. It will be apparent to one skilled in the art that embodiments of the present disclosure may be practiced without these specific details. In other instances, well-known features, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein the term "diffusion" is intended to refer to the precisely controlled introduction of dopants into a material, by means of a solid, liquid or gaseous source, to give the material desired properties.

As used herein the term "diffused region" is intended to refer to a region of a volume of material, where dopants have been introduced by diffusion, that has a larger concentration of dopants than does the volume of material in general.

As used herein the term "doped region" is intended to refer to a region of a volume of material, where dopants have been introduced, that has a larger concentration of dopants than does the volume of material in general.

As used herein the term "doping" is intended to refer to the introduction of impurity elements into material to give the material desired properties.

In one embodiment, as used herein "doping" can be performed by methods that can include but are not limited to diffusion and ion implantation.

In one embodiment, as used herein the term "dotted" is intended to refer to a structural organization of polysilicon in a solar cell that is characterized by the presence of an ordered plurality of non-contiguous and electrically separated polysilicon islands that are surrounded by trenches.

In one embodiment, as used herein the term "polysilicon" is intended to refer to polysilicon, or polysilicon that contains impurities that can include but are not limited to oxygen and carbon.

In one embodiment, as used herein the term "backside" is intended to refer to a backside of a solar cell that is opposite to the front side of the solar cell, wherein the front side of the solar cell faces the sun during normal operation. In one embodiment, as used herein the term "backside contact solar cell" is intended to refer to a solar cell where all electrical connections to its collection regions are formed on its backside. In one embodiment, in a backside contact solar cell, both doped regions and interdigitated metal contact fingers coupled to them, are located on the backside of the solar cell. In one embodiment, the contact fingers allow an external electrical circuit to be coupled to and powered by the solar cell.

In one embodiment, the term "non-contiguous" polysilicon is intended to refer to non-continuous and separated portions of polysilicon. In particular, to a plurality of non-continuous and separated (by surrounding trenches) polysilicon islands having a bounded periphery that can include various shapes.

Solar cells convert solar radiation to electrical energy. A solar cell typically includes p-type and n-type doped regions. Solar radiation impinging the surface of the solar cell creates electrons and holes that migrate to the doped regions and cause voltage differentials to develop between the doped regions. In a backside contact solar cell, the doped regions and metal contacts that are coupled to them are located on the backside of the solar cell. The metal contacts allow an external electrical circuit to be coupled to and powered by the solar cell.

Solar cell efficiency is an important operational characteristic of solar cells as solar cell efficiency is directly related to its capacity to generate power. Carrier recombination is a significant factor in the determination of solar cell efficiency because carriers that recombine may not provide a net contribution to the current that is produced by a solar cell. Diffused trenches (e.g., trenches with a diffusion of dopants into portions of the wafer volume that underlies them) can be the part of the surface of a solar cell with the least favorable recombination properties. In addition, the parts of the surface of a solar cell where metal components come into contact with the semiconductor wafer can have unfavorable carrier recombination properties.

A solar cell is disclosed herein that addresses these challenges. In one embodiment, the solar cell incudes a substrate, a dielectric layer formed on a backside of the substrate, and a plurality of non-contiguous doped polysilicon islands having a first polarity on the dielectric layer. The solar cell also includes at least one doped polysilicon region having a second polarity on the dielectric layer, laterally disposed to the plurality of non-contiguous doped polysilicon regions.

In one embodiment, diffused trenches with narrow dimensions are enabled by self-alignment processes described herein. The limiting of the width of trenches which are the part of the solar cell surface with the least favorable carrier recombination properties, can have a favorable effect on carrier recombination properties. In addition, in one embodiment, because metal layers in the solar cell contact polysilicon and not the semiconductor wafer, another common source of unfavorable carrier recombination is avoided. Consequently, the solar cell architecture limits the opportunities for carrier recombination that may be available in differently designed solar cells. In one embodiment, the limiting of opportunities for carrier recombination is designed to mitigate carrier recombination such that the voltage and the net contribution of carriers to the current that is produced by the solar cell, and the efficiency of the solar cell, is favorably affected.

Solar Cell

FIG. 1A shows a cross-section of a portion of a solar cell 100 (hereinafter "the solar cell 100") according to one embodiment. In one embodiment, the solar cell 100 includes wafer 101, tunnel oxide 103, n-doped polysilicon 105, p-doped polysilicon $107_1$, trench 108a, trench 108b, doped region 109a, doped region 109b, insulating layer 111, insulating layer 113, wiring layer 115, and wiring layer 117.

Referring to FIG. 1A, the wafer 101 forms the substrate upon which the semiconductor, insulator and wiring layers of the solar cell 100 are formed. In one embodiment, the tunnel oxide 103 is formed on the surface of the wafer 101 and includes spaces through which the doped regions 109a and 109b are formed, and in which the insulating layer 113 is formed. In one embodiment, the p-doped polysilicon layer $107_1$ is formed on a portion of the tunnel oxide 103 that lies between portions of the tunnel oxide 103 located underneath laterally situated portions of the n-doped polysilicon layer 105. In one embodiment, the p-doped polysilicon layer $107_1$ includes sides that are covered by the insulating layer 113 and a top surface that is partially covered by the insulating layer 113. In addition, in one embodiment, the p-doped polysilicon layer $107_1$ is contacted on its top surface through a space in the insulating layer 113 by wiring layer 115. In one embodiment, the n-doped polysilicon layer 105 is formed on the surface of the tunnel oxide 103 and is laterally separated from the p-doped polysilicon layer $107_1$ by portions of the insulating layer 113 that extend into spaces (on both sides of the p-doped polysilicon layer $107_1$) in the tunnel oxide 103. In one embodiment, the doped region 109a is formed in the surface of wafer 101 below a portion of the insulating layer 113 that extends into a first space in the tunnel oxide 103. In one embodiment, the doped region 109a laterally extends underneath a portion of the tunnel oxide 103 that is formed underneath the p-doped polysilicon layer $107_1$ and a portion of the tunnel oxide 103 that is formed underneath the n-doped polysilicon layer 105. In one embodiment, the doped region 109b is formed in the surface of wafer 101 below a portion of the insulating layer 113 that extends into a second space in the tunnel oxide 103. In one embodiment, the doped region 109b laterally extends underneath a portion of the tunnel oxide 103 that is formed underneath the p-doped polysilicon layer $107_1$ and a portion of the tunnel oxide 103 that is formed underneath the n-doped polysilicon layer 105. In one embodiment, the insulating layer 113 is formed above insulating layer 111, along the bottom and sidewalls of the trenches 108a and 108b (that are located above the doped regions 109a and 109b), and on a the top surface of the p-doped polysilicon layer $107_1$. In one embodiment, the insulating layer 113 includes openings above the p-doped polysilicon layer $107_1$ and the n-doped polysilicon layer 105 that enable the p-doped polysilicon layer $107_1$ and the n-doped polysilicon layer 105 to be contacted by the wiring layer 115 and the wiring layer 117 respectively. In one embodiment, the insulating layer 111 is formed above the n-doped polysilicon layer 105 and includes an opening above the n-doped polysilicon layer 105 that enables the n-doped polysilicon layer to be contacted by the wiring layer 117. In one embodiment, trenches 108a and 108b are opposite side cross-sectional parts of a trench (e.g., trench $108_1$ described with reference to FIG. 1B) that surrounds the p-doped polysilicon layer $107_1$.

Referring to FIG. 1A, in one embodiment, wiring layer 115 can occupy a larger area than does the p-doped polysilicon layer $107_1$. However, in other embodiments, the wiring layer 115 can be confined to the area occupied by the p-doped polysilicon layer $107_1$, or to the area occupied by the p-doped polysilicon layer $107_1$ and the area occupied by the p-type doped regions 109a and 109b. In one embodiment, the confinement of the wiring layer 115 to the semiconductor regions of p-type conductivity can involve the use of a larger p-type semiconductor area. In other embodiments, the confinement of the wiring layer 115 to the semiconductor regions of p-type conductivity may not involve the use of a larger p-type semiconductor area. In one embodiment, the wiring layer 115 can be confined to p-type semiconductor regions that do not have continuous or contiguous configurations and can have a cell architecture with module interconnections that can include but is not limited to conductive circuit boards, such as for metallization wrap through (MWT) solar cells and interdigitated back contact (IBC) solar cells.

Referring to FIG. 1B, in one embodiment, the trenches 108a and 108b, shown in FIG. 1A, are opposite side cross-sectional parts of a trench $108_1$ that is formed around the p-doped polysilicon layer $107_1$ and above the doped region $109_1$. Moreover, in one embodiment, the trench $108_1$ is one of a plurality of trenches $108_1$-$108_n$ formed around a plurality of polysilicon islands $107_1$-$107_n$ in solar cell 100 (in FIG. 1B the arrows indicate the location of the trenches $108_1$-$108_n$ relative to the doped regions $109_1$-$109_n$). In one embodiment, the trenches can have shapes that include but are not limited to circular, rectangular, elongated, elliptical, polygonal and irregular. In one embodiment, the polysilicon islands $107_1$-$107_n$ function as emitters that have surface areas that are a fraction of the surface area of the n-doped polysilicon layer 105 (emitter). In one embodiment, the trenches $108_1$-$108_n$ are self-aligned as described herein with reference to FIGS. 3A-3G, 4A-4G, and 5A-5E. In one embodiment, the self-alignment enables the formation of a narrower trench than can be obtained by some other processes. In one embodiment, because a diffused trench can form a part of a surface area that may experience elevated levels of recombination, a narrow trench can operate to favorably affect recombination and performance.

In one embodiment, the polysilicon islands $107_1$-$107_n$ are a plurality of non-contiguous doped polysilicon regions of p-type conductivity that are formed in lasered regions of the semiconductor structure (see FIGS. 3A-3G, 4A-4G, and 5A-5E). In one embodiment, the wiring layer 115 (FIG. 1A), which is associated with semiconductor regions of p-type polarity (e.g., $107_1$-$107_n$), overlap semiconductor regions of n-type polarity (however in some other embodiments, overlap of the semiconductor regions of one polarity and the metallization associated with semiconductor regions of the other polarity is avoided).

In one embodiment, the wafer 101 can be formed from silicon. In other embodiments, the wafer 101 can be formed from other materials. In one embodiment, the tunnel oxide 103 can be formed from silicon oxide. In other embodiments, the tunnel oxide 103 can be formed from other materials. In one embodiment, the doped polysilicon layer 105 can be doped with phosphorous. In other embodiments, the doped polysilicon layer 105 can be doped with other impurities. In one embodiment, the doped polysilicon layer $107_1$ can be doped with boron. In other embodiments, the doped polysilicon layer $107_1$ can be doped with other impurities. In one embodiment, the doped regions 109a and 109b can be doped with boron. In other embodiments, the doped regions 109a and 109b can be doped with other materials. In one embodiment, the insulating layer 111 can include borophosphorous silicate glass and undoped silicate glass (hereinafter "BPSG (+USG)"). In other embodiments, insulating layer 111 can include other materials. In one embodiment, the insulating layer 113 can include borosilicate glass and undoped silicate glass and silicon nitride (hereinafter "BSG (+USG)+SiN"). In other embodiments, the insulating layer 113 can include other materials. In one embodiment, the wiring layer 115 can include aluminum, nickel, chromium, gold, germanium, copper, silver, titanium, tungsten, tin, platinum, and tantalum. In other embodiments, the wiring layer 115 can include other materials. In one embodiment, the wiring layer 117 can include aluminum, nickel, chromium, gold, germanium, copper, silver, titanium, tungsten, tin, platinum, and tantalum. In other embodiments, the wiring layer 117 can include other materials.

Operation

In operation, upon exposure to light, the solar cell 100 converts light energy into electricity based on the photovoltaic effect. Some carriers reach the p-n junction and contribute to the current produced by the solar cell 100. However, other carriers recombine with no net contribution to the current produced by the solar cell 100. Carrier recombination is a significant factor in the determination of solar cell efficiency. Diffused trenches can be the part of the surface of the solar cell 100 that has the least favorable recombination properties. However, in one embodiment, the narrowness of the diffused trenches 108a and 108b that is enabled by the self-alignment process that is described herein (with reference to FIGS. 3A-3G, 4A-4G, and 5A-5E), can be beneficial as regards carrier recombination in that part of the surface of the solar cell 100. Metal contacted doped regions are another significant source of carrier recombination. In one embodiment, the solar cell 100 does not employ a direct metal contact of any part of the wafer 101. Thus, the solar cell 100 is designed in a manner that limits the opportunities for carrier recombination that may be available with differently designed solar cells. In one embodiment, the limiting of opportunities for carrier recombination can have a favorable effect on carrier recombination and solar cell efficiency.

FIG. 2A shows a cross-section of components of a solar cell 200 (hereinafter "the solar cell 200") according to one embodiment. In one embodiment, the solar cell 200 includes wafer 201, tunnel oxide 203, p-doped polysilicon 205, n-doped polysilicon $207_1$, trench 208a, trench 208b, doped region 209a, doped region 209b, insulating layer 211, insulating layer 213, wiring layer 215, and wiring layer 217.

Referring to FIG. 2A, in one embodiment, the wafer 201 forms the substrate upon which semiconductor, insulator and wiring layers of the solar cell 200 are formed. In one embodiment, the tunnel oxide 203 is formed on the surface of the wafer 201 and includes spaces through which the doped regions 209a and 209b are formed, and in which the insulating layer 213 is formed. In one embodiment, the n-doped polysilicon layer $207_1$ is formed on a portion of the tunnel oxide 203 that lies between portions of the tunnel oxide 203 located underneath laterally situated portions of the p-doped polysilicon layer 205. The n-doped polysilicon layer $207_1$ includes sides that are covered by the insulating layer 213 and a top surface that is partially covered by the insulating layer 213. In addition, in one embodiment, the n-doped polysilicon layer $207_1$ is contacted on its top surface through a space in the doped insulating layer 213 by wiring layer 215. In one embodiment, the p-doped polysilicon layer 205 is formed on the surface of the tunnel oxide 203 and is laterally separated from the n-doped polysilicon layer $207_1$ by portions of the insulating layer 213 that extend into spaces (on both sides of the n-doped polysilicon layer $207_1$) in the tunnel oxide 203. In one embodiment, the doped region 209a is formed in the surface of wafer 201 below a portion of the insulating layer 213 that extends into a first space in the tunnel oxide 203. In one embodiment, the doped region 209a laterally extends underneath a portion of the tunnel oxide 203 that is formed underneath the n-doped polysilicon layer $207_1$ and a portion of the tunnel oxide 203 that is formed underneath the p-doped polysilicon layer 205. In one embodiment, the doped region 209b is formed in the surface of wafer 201 below a portion of the insulating layer 213 that extends into a second space in the tunnel oxide 203. In one embodiment, the doped region 209b laterally extends underneath a portion of the tunnel oxide 203 that is formed underneath the n-doped polysilicon layer $207_1$ and a portion of the tunnel oxide 203 that is formed underneath the p-doped polysilicon layer 205. In one embodiment, the insulating layer 213 is formed above insulating layer 211, along the bottom and sidewalls of the trenches 208a and 208b (that are located above the doped regions 209a and 209b), and on portions of the top surface of the n-doped polysilicon layer $207_1$. In one embodiment, the insulating layer 213 includes openings above the n-doped polysilicon layer $207_1$ and the p-doped polysilicon layer 205 that enable the n-doped polysilicon layer $207_1$ and the p-doped polysilicon layer 205 to be contacted by the wiring layer 215 and the wiring layer 217 respectively. In one embodiment, the insulating layer 211 is formed above the p-doped polysilicon layer 205 and includes an opening above the p-doped polysilicon layer 205 that enables the p-doped polysilicon layer 205 to be contacted by the wiring layer 217. In one embodiment, trenches 208a and 208b are opposite side cross-sectional parts of a trench (e.g., trench $208_1$ described with reference to FIG. 2B) that surrounds the n-doped polysilicon layer $207_1$.

Referring to FIG. 2A, in one embodiment, the wiring layer 215 can occupy a larger area than does the n-doped polysilicon layer $207_1$. However, in other embodiments, the wiring layer 215 can be confined to the area occupied by the n-doped polysilicon layer $207_1$, or to the area occupied by the n-doped polysilicon layer $207_1$ and the area occupied n-doped regions 209a and 209b. In one embodiment, the confinement of the wiring layer 215 to the semiconductor regions of n-type conductivity can involve the use of a larger n-type semiconductor area. In other embodiments, the confinement of the wiring layer 215 to the semiconductor regions of n-type conductivity may not involve the use of a larger n-type semiconductor area. In one embodiment, the wiring layer 215 can be confined to n-type semiconductor regions that do not have continuous or contiguous configurations and can have a cell architecture with module interconnections that can include but is not limited to conductive circuit boards for metallization wrap through (MWT) solar cells and interdigitated back contact (IBC) solar cells.

Referring to FIG. 2B, in one embodiment, the trenches 208a and 208b, shown in FIG. 2A, are opposite side cross-sectional parts of a trench $208_1$ (in FIG. 2B the arrows indicate the location of the trenches $208_1$-$208_n$ relative to the doped regions $209_1$-$209_n$) that is formed around the n-doped polysilicon layer $207_1$ and above the doped region $209_1$. Moreover, the trench $208_1$ is one of a plurality of trenches $208_1$-$208_n$ formed around a plurality of polysilicon islands $207_1$-$207_n$ in the solar cell 200. In one embodiment, the polysilicon islands $207_1$-$207_n$ function as emitters that have surface areas that are a fraction of the surface area of the p-doped polysilicon layer 205. In one embodiment, the trenches can have shapes that include but are not limited to circular, rectangular, elongated, elliptical, polygonal and irregular.

In one embodiment, the trenches $208_1$-$208_n$ are self-aligned as described herein with reference to FIGS. 3A-3G, 4A-4G, and 5A-5E. In one embodiment, the self-alignment enables the formation of a narrower trench than can be obtained by some other approaches. In one embodiment, because diffused trenches can form a part of a surface area that may experience elevated levels of recombination, the narrow trench can favorably affect carrier recombination and solar cell performance.

In one embodiment, the polysilicon islands $207_1$-$207_n$ are a plurality of non-contiguous doped polysilicon regions of n-type conductivity that are formed in lasered regions of the semiconductor structure (see FIGS. 3A-3G, 4A-4G, and 5A-5E). In one embodiment, the wiring layer 215 (FIG. 2A), which is associated with semiconductor regions of n-type polarity, overlap semiconductor regions of p-type polarity (in some other embodiments overlap of the semiconductor regions of one polarity and the metallization associated with semiconductor regions of the other polarity is avoided). In one embodiment, the final n-doped polysilicon islands $207_1$-$207_n$ can include some p-type dopant. In addition, the n-type conductivity can be achieved by overcompensation with phosphorus or another n-type dopant, such as arsenic (As).

Referring again to FIG. 2A, in one embodiment, the wafer 201 can be formed from silicon. In other embodiments, the wafer 201 can be formed from other materials. In one embodiment, the tunnel oxide 203 can be formed from silicon oxide. In other embodiments, the tunnel oxide 203 can be formed from other materials. In one embodiment, the p-doped polysilicon layer 205 can be doped with boron. In other embodiments, the p-doped polysilicon layer 205 can be doped with other impurities. In one embodiment, the n-doped polysilicon layer $20'71$ can be doped with phosphorus. In other embodiments, the n-doped polysilicon layer $20'71$ can be doped with other impurities. In one embodiment, the doped regions 209a and 209b can be doped with phosphorus. In other embodiments, the doped regions 209a and 209b can be doped with other materials. In one embodiment, the insulating layer 211 can include BSG (+USG). In other embodiments, the insulating layer 211 can include other materials.

In one embodiment, the insulating layer 213 can include phosphosilicate glass and undoped silicate glass and silicon nitride (hereinafter "PSG (+USG)+SiN"). In other embodiments, the insulating layer 213 can include other materials. In one embodiment, the wiring layer 215 can include aluminum, nickel, chromium, gold, germanium, copper, silver, titanium, tungsten, tin, platinum, and tantalum. In other embodiments, the wiring layer 215 can include other materials. In one embodiment, the wiring layer 217 can include aluminum, nickel, chromium, gold, germanium, copper, silver, titanium, tungsten, tin, platinum, and tantalum. In other embodiments, the wiring layer 217 can include other materials.

Operation

In operation, upon exposure to light, the solar cell 200 converts light energy into electricity based on the photovoltaic effect. Some carriers reach the p-n junction and contribute to the current produced by the solar cell 200. However, other carriers recombine with no net contribution to the current produced by the solar cell 200. Carrier recombination is a significant factor in the determination of solar cell efficiency. The diffused trenches 208a and 208b can be the part of the surface of the solar cell 200 that has the least favorable recombination properties. However, in one embodiment, the narrowness of the diffused trenches 208a and 208b that is enabled by the self-alignment process that is described herein (with reference to FIGS. 3A-3G, 4A-4G and 5A-5E), can be beneficial as regards carrier recombination in that part of the surface of the solar cell 200. In addition, in one embodiment, the solar cell 200 does not employ metal contact of any part of the wafer 201. Thus, the solar cell 200 is designed in a manner that limits the opportunities for carrier recombination that may be available with differently designed solar cells. In one embodiment, the limiting of opportunities for carrier recombination can have a favorable effect on carrier recombination and solar cell efficiency.

Solar Cell Fabrication Process

FIGS. 3A-3G are illustrations of cross-sections of a multilayer semiconductor structure 300 during fabrication of a solar cell according to one embodiment. Referring to 3A, a cross-section of the multilayer semiconductor structure 300 is shown after initial operations that include depositing a multilayer stack of dielectrics in plasma enhanced chemical vapor deposition (PECVD) or atmospheric pressure chemical vapor deposition (APCVD) onto an intrinsic polysilicon layer that is formed above a wafer. In one embodiment, the semiconductor structure 300 includes wafer 301, tunnel oxide 303, polysilicon layer 305, borosilicate glass (BSG) layer 307, phosphosilicate glass (PSG) layer 309, undoped silicate glass (USG) layer 311, and amorphous silicon (a-Si) layer 313. In one embodiment, the BSG layer 307 can have a thickness of 10 nm. In other embodiments, the BSG layer 307 can have other thicknesses. In one embodiment, the PSG layer 309 can have a thickness of 30 nm. In other embodiments, the PSG layer 309 can have other thicknesses. In one embodiment, the USG layer 311 can have a thickness of 60 nm. In other embodiments, the USG layer 311 can have other thicknesses. In one embodiment, the amorphous a-Si layer 313 can have a thickness of 45 nm. In other embodiments, the a-Si layer 313 can have other thicknesses.

Figure 3B:
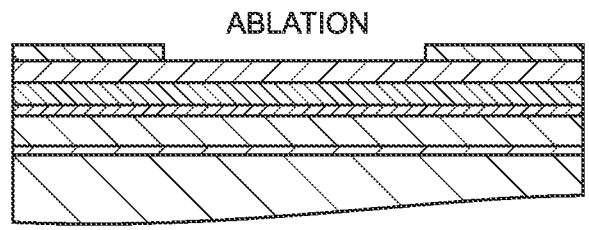

Referring to FIG. 3B, after operations that result in the cross-section shown in FIG. 3A, a laser operation is performed on the a-Si layer 313. In one embodiment, the laser operation removes portions of the a-Si layer 313 to form a plurality of openings in the a-Si layer 313. In other embodiments, other manners of forming the openings in the a-Si layer 313 can be used.

Figure 3C:
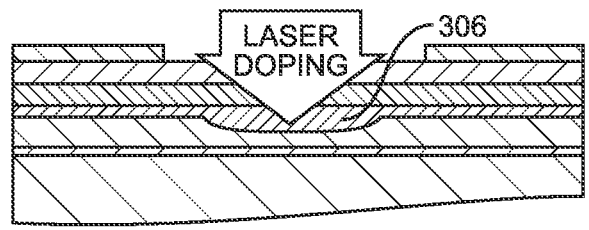

Referring to FIG. 3C, after one or more operations resulting in the cross-section shown in FIG. 3B, a subsequent laser operation is performed. In one embodiment, the subsequent laser operation is performed in order to form a plurality of boron doped surface areas 306 in at least a portion of the regions of the polysilicon layer 305 that correspond to the openings in the a-Si layer 313. In one embodiment, the subsequent laser operation forward transfers boron into at least a portion of the regions of the polysilicon layer 305 that correspond to the openings in the a-Si layer 313. In other embodiments, other manners of forming boron doped surface areas in the polysilicon layer 305 can be used. In one embodiment, the pulses used in the laser operations can have a gaussian-shaped pulse profile, or a beam profile that is nearly flat top or flat-top like, characterized by a non-abrupt change in intensity from the high-intensity beam center to a zero-intensity outside-of-pulse region. In other embodiments, laser operations like those described with reference to FIGS. 3B and 3C can include other type pulse and beam profiles.

In one embodiment, when two laser pulses are used (e.g., for self-alignment purposes fired in the same equipment, or provided in single pulse bursts), such as the respective pulses associated with the laser operations described with reference to FIGS. 3B and 3C, the boron transfer process may involve the use of a lower pulse energy than is required for a-Si-ablation. In such cases, the second pulse (that is used to effectuate boron transfer), can be provided with a pulse energy that does not cause the removal of a-Si from the perimeter of the ablated a-Si opening, but has sufficient power to effectuate boron transfer from the BSG layer 307 to at least a portion of the polysilicon lying inside a region circumscribed by the ablated a-Si opening.

In one embodiment, to prepare the semiconductor structure 300 for the formation of trenches, the boron-doped surface regions 306 can be formed to have a smaller diameter than the ablated a-Si openings. In one embodiment, the boron-doped surface regions 306 can be formed to have a smaller diameter than the ablated a-Si openings using a suitable laser beam profile or by using two pulses, where the second pulse has a smaller diameter or reduced intensity that causes smaller diameter boron-doped surface regions 306 than ablated a-Si openings. In one embodiment, the perimeters of the boron-doped surface regions 306 determine the position of the inner sidewall of the trenches and the perimeters of the ablated a-Si openings determines the position of the outer sidewalls of the trenches. In other embodiments, where the etching operation is designed to cause the etching of portions of the polysilicon layer 305 that are located underneath the stack of dielectrics (e.g., borosilicate glass (BSG) layer 307, phosphosilicate glass (PSG) layer 309, undoped silicate glass (USG) layer 311), the lateral extent of the etching of the polysilicon away from the perimeter of the boron-doped surface region 306 determines the position of the outer sidewalls of the trenches. Referring again to FIG. 3C, in one embodiment, in the region (circular, rectangular, elongated, elliptical, irregular, etc.) between the perimeter of the ablated a-Si opening and the perimeter of the boron-doped surface region 306, polysilicon can be etched to form the trench in the subsequent etching processes.

In one embodiment, where the second laser operation results in boron-doped surface regions 306 of polysilicon layer 305 with a diameter that is not smaller than the diameter of ablated a-Si openings, lateral etching of the dielectrics, under the a-Si layer 313 can be utilized to widen the opening in the stack of dielectrics (e.g., borosilicate glass (BSG) layer 307, phosphosilicate glass (PSG) layer 309, undoped silicate glass (USG) layer 311) such that a subsequent KOH etch (described with reference to FIG. 3D) can access the undoped polysilicon in the circumferential region around the boron-doped regions 306.

In one embodiment, the second laser operation described with reference to FIG. 3C, can use a laser pulse with a higher power than the power possessed by the a-Si ablating first pulse, to form boron-doped surface regions 306 in the polysilicon layer 305. In this embodiment, the boron-doped surface regions 306 are formed in the portions of the polysilicon layer 305 that are aligned with the openings in the a-Si layer by transmitting the higher power pulse freely through the openings in the a-Si layer. In one embodiment, because the second pulse has a higher power, and a greater diameter, than the first laser pulse, it can ablate the a-Si around the perimeter of the existing openings in the a-Si layer. Consequently, in one embodiment, the second laser pulse both forms boron-doped surface regions in the polysilicon layer 305 that are aligned with the openings in the a-Si layer and ablates the a-Si around the perimeter of the openings. In one embodiment, a subsequent etching of the stack of dielectrics (borosilicate glass (BSG) layer 307, phosphosilicate glass (PSG) layer 309, undoped silicate glass (USG) layer 311), including the portions of the stack of dielectrics that are exposed by the second laser pulse that has a higher power and greater diameter than the first laser pulse, can be used to expose at least some of the portions of the polysilicon layer 305 that are to be removed during a subsequent etching of the polysilicon layer 305 as a part of forming desired trenches.

Figure 3D:
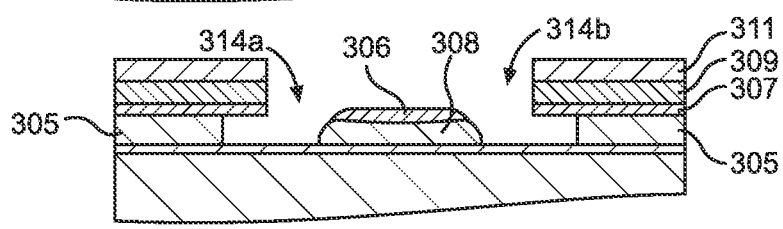

Referring to FIG. 3D, after one or more operations resulting in the cross-section shown in FIG. 3C, a process that includes etching in hydrofluoric acid (HF) and then in potassium hydroxide (KOH) is performed. In particular, in one embodiment, initially an HF etch is used to remove portions of the USG layer 311, the PSG layer 309, and the BSG layer 307 and then a KOH etch is used to remove portions of the polysilicon layer 305 (that surround the perimeters of the boron doped surfaces in the polysilicon layer 305) and the remaining portions of the a-Si layer 313. In other embodiments, other etching processes can be used. In one embodiment, the boron previously transferred into the surface of the polysilicon layer 305 forms an etch resist against the potassium hydroxide (KOH) that is used in the etching process. The result is a plurality of boron doped polysilicon islands 308 located in the center of the polysilicon layer 305 (see FIG. 1B) that are surrounded by a plurality of trenches. Referring to FIG. 3D, trenches 314a and 314b are opposite side cross-sectional parts of a trench that surrounds the polysilicon island 308 associated with the boron doped surface region 306 shown in FIG. 3D. In one embodiment, first etching in HF may be done if an a-Si layer is used as a laser-structured HF etch barrier. In other embodiments, where the oxide stack (borosilicate glass (BSG) layer 307, phosphosilicate glass (PSG) layer 309, undoped silicate glass (USG) layer 311) are directly ablated an a-Si layer is not needed.

In one embodiment, the trenches are etched in the regions of the polysilicon layer 305, that are aligned with regions without a-Si covering the BSG layer 307, and without the boron-doped surfaces 306 acting as etch resist, that are formed between the perimeters of the openings in the a-Si layer and the perimeters of the boron-doped surfaces 306 in the polysilicon layer 305. In one embodiment, the regions of the polysilicon layer 305 aligned with regions without a-Si covering the BSG layer 307 and without the boron-doped surfaces 306 acting as etch resist can have shapes that include but are not limited to circular, elliptical, elongated, rectangular and irregular. In some embodiments, the HF etch can be executed for a period that is longer than a normal duration of the etch for removing the dielectric layer stack in order to achieve lateral etching from the ablated region outward into the non-ablated regions, e.g., etching under the region of the non-ablated a-Si outward (see FIG. 3D). In one embodiment, a normal duration of the etch is the time required to remove the dielectric material that lies in the regions circumscribed by the openings in the a-Si layer 313 that are located above the polysilicon layer 305.

Figure 3E:
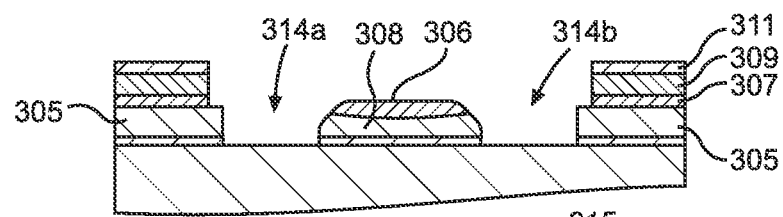

Referring to FIG. 3E, after one or more operations resulting in the cross-section shown in FIG. 3D, a cleaning process is performed. In one embodiment, the cleaning process removes additional material, such as additional portions of the USG layer 311, the PSG layer 309, the BSG layer 307, and portions of the tunnel oxide 303 that are located in the trenches 314a and 314b, from the semiconductor structure 300. In one embodiment, the portions of the PSG layer 309 that remain (only a small amount of the PSG layer 309 at the sidewalls of the trench is removed in the cleaning process) are used in subsequent operations as the dopant source for the n-type doping of the lateral portions of the polysilicon layer 305 that lie outside of the lasered region.

Figure 3F:
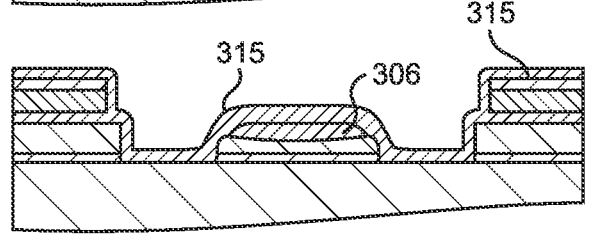

Referring to FIG. 3F, after one or more operations resulting in the cross-section shown in FIG. 3E, a deposition of dopant containing material is performed. In one embodiment, the deposition of dopant containing material 315 can include but is not limited to the deposition of a BSG layer or a BSG layer stack.

Figure 3G:
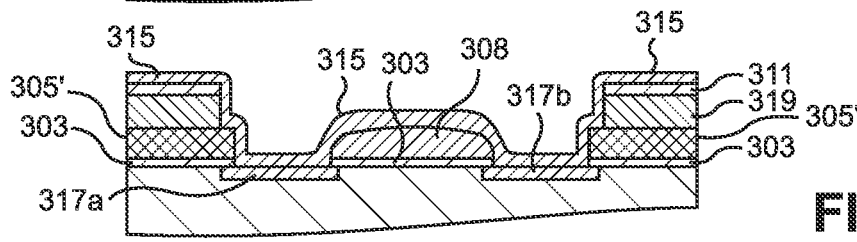

Referring to FIG. 3G, after one or more operations resulting in the cross-section shown in FIG. 3F, a thermal process is performed. In one embodiment, the thermal process causes boron to diffuse out of the BSG layer or BSG layer stack into the polysilicon islands with boron doped surfaces 306. In addition, in one embodiment, the thermal process causes boron to diffuse out of the BSG layer or BSG layer stack into areas of the wafer 301 that are located under and around the bottom of the trenches 314a and 314b (extending underneath portions of the tunnel oxide 303 located on both sides of the trenches 314a and 314b). In one embodiment, this diffusion of boron produces p+ diffused regions 317a and 317b in areas of the wafer 301 located under and around the bottom of the trenches 314a and 314b (extending underneath portions of the tunnel oxide 303 located on both sides of the trenches 314a and 314b).

In one embodiment, in the non-lasered region the thermal process causes mostly phosphorus to diffuse into the polysilicon layer 305 to form n-type polysilicon layer 305'. In one embodiment, this is done by formation of BPSG 319 from the BSG 307/PSG 309 stack in high temperature. In one embodiment, the BPSG 319 is used as a phosphorus diffusion source. In one embodiment, there can be a small and inconsequential amount of boron diffusion into the non-lasered regions of the polysilicon layer 305 from the BPSG 319.

In one embodiment, as regards the formation of the trenches, as described herein, the formation of a trench around the polysilicon region in the center of the ablation region can be done even if the boron doping occurs in the entire region of a-Si ablation. For example, because the process involves first etching in HF and then in KOH, the HF etch can be executed longer, so as to achieve lateral etching from the ablated region outward into the non-ablated regions (e.g., etching under the non-ablated a-Si outward). This process provides the KOH access to regions of the polysilicon around the boron-doped polysilicon, enabling the KOH to remove regions of the polysilicon around the boron doped center to form a trench.

In addition, in one embodiment, as described herein, a second laser pulse can be executed with higher power than the first laser pulse. In such cases, laser doping (boron doping) can be achieved in the region where the first laser pulse has already removed a-Si, by laser power transmitted through the ablated hole region in the a-Si layer. In one embodiment, because the second pulse has higher power, it can bring the a-Si in a perimeter region around the initial ablated hole region to ablation, such that in the region of the initial ablated a-Si hole formed by the first laser pulse, the second laser pulse forms boron-(surface-)doped polysilicon. In particular, because the second laser pulse passes freely through the opening formed by the removal of a-Si by the first laser pulse, the second laser pulse passes through the opening without being damped by absorption in a-Si as a part of forming the boron-(surface-)doped polysilicon. In addition, a perimeter around the first ablated a-Si hole is freed from a-Si. In that region, the process of first etching in HF and then in KOH results in the etching of the silicate glass layers, to expose the polysilicon that is not boron-doped and the creation of the desired trench by KOH etching.

In one embodiment, as regards embodiments that involve the formation of a self-aligned trench (removed polysilicon) around a center region where polysilicon remains (by KOH etch stop-action from boron doping), advantageous use of the second laser pulse (in embodiments where two laser processes are used) is made by doping essentially all or all of the region where the first pulse creates the a-Si ablation, and by using the lateral etching approach (with HF) to remove the portions of the silicate glass layers around the boron-doped region, such that the polysilicon in the undoped perimeter can be removed by the KOH etching.

In one embodiment, although processes are described for boron doping in the lasered regions, the reverse doping structure can be provided by a similar process. For example, BSG can be used (instead of a stack of BSG/PSG) under the USG/a-Si layer, and instead of a second BSG layer, a PSG layer can be used. The phosphorus doping over-compensates in the region that is initially only boron-doped to form by the action of deposited PSG and thermal operations a center region with n-type conductivity.

In one embodiment, a common feature of the processes used to produce solar cell 100 and solar cell 200 is that the lasered regions of the polysilicon have the same doping type as the doping diffusion in the trench region. However, in one embodiment, for solar cell 200 the lasered polysilicon region with n-type conductivity can be formed from phosphorus overcompensation of also boron-doped polysilicon. Moreover, in one embodiment, for solar cell 200, in the non-lasered region mostly boron is diffused into the polysilicon. In one embodiment, the boron is diffused in high temperature from the BSG that is located on the polysilicon. FIGS. 4A-4G describe a methodology for forming a solar cell having a structure similar to that of solar cell 200 shown in FIG. 2A.

Figure 4A:
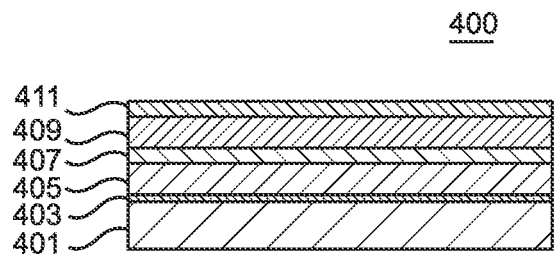
FIGS. 4A-4G are illustrations of cross-sections of a multilayer semiconductor structure during fabrication of a solar cell according to one embodiment.

FIGS. 4A-4G are illustrations of cross-sections of a semiconductor structure 400 during fabrication of a solar cell according to one embodiment. Referring to FIG. 4A, a cross-section of a multilayer semiconductor structure 400 is shown after initial operations that include depositing a multilayer stack of dielectrics (BSG and USG) in PECVD or APCVD onto an intrinsic polysilicon layer before laser operations. In one embodiment, the semiconductor structure 400 includes wafer 401, tunnel oxide layer 403, polysilicon layer 405, BSG layer 407, USG layer 409, and a-Si layer 411.

Figure 4B:
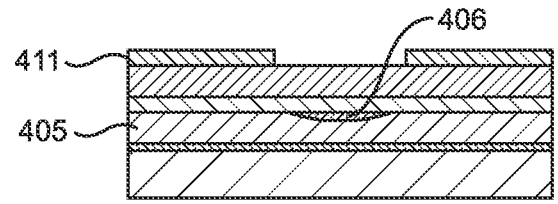

Referring to FIG. 4B, after operations resulting in the cross-section shown in FIG. 4A, a laser operation is performed that both ablates portions of the a-Si layer 411 and causes the formation of a plurality of boron-doped surface regions 406 in portions of the polysilicon layer 405 that are aligned with the center of the openings in the a-Si layer 411. In particular, in one embodiment, a single laser pulse is used to both ablate portions of the a-Si layer 411 and cause the formation of the plurality of boron-doped surface regions. In one embodiment, the laser operation can be performed using a nanosecond laser. In one embodiment, the laser operation can be performed using a picosecond laser. In one embodiment, regardless the pulse-length of the laser used, the laser operation can be performed using a single laser pulse having the capacity to both ablate portions of the a-Si layer 411 and cause the formation of the plurality of boron-doped surface regions 406 in portions of the polysilicon layer 405. In one embodiment, between the perimeters of the openings in the a-Si layer 411 and the perimeter of the boron-doped surface regions 406, there may be no boron doping from the BSG layer 407 transferred to the underlying polysilicon.

In other embodiments, the laser ablation and boron transfer operations can be performed using a multi-pulse (e.g., double pulse) nanosecond laser. In still other embodiments, the laser ablation and boron transfer operations can be performed using a multi-pulse (e.g., double pulse) picosecond laser. In still other embodiments, other types of lasers can be used. In one embodiment, the laser can include but is not limited to a 355 nm ps (picosecond) laser and a 532 nm ps (picosecond) laser. In other embodiments, the laser can have other wavelength and/or pulse width characteristics.

In one embodiment, where boron-transfer and ablation (a-Si ablation or direct ablation of the BSG containing dielectric stack are performed with a single laser pulse, a sufficient amount of laser fluence (e.g., intensity) in the pulse is needed to ablate the a-Si (or in an alternative embodiment ablate the multi-layer dielectric stack that includes the BSG). In one embodiment, with a circular-shaped Gaussian laser pulse, a circular ring is formed around the center of the laser spot (for other shaped laser pulses other shaped a-Si ablated or BSG-ablated perimeters will be formed). In one embodiment, the laser intensity may be sufficiently high to cause ablation of the entire area inside the perimeter, however just inside the perimeter, up to a certain distance away from the center of the laser ablation region, there may not be enough laser fluence to effectuate boron transfer. For example, in one embodiment, at the perimeter of the ablated a-Si region, the incident laser power may be exhausted in effecting ablation, and though just inside the perimeter the laser beam profile may have a higher intensity (fluence) than it has at the perimeter, it may not be sufficiently intense to effectuate boron transfer. In one embodiment, the outer perimeter of boron transfer is further inward, away from the perimeter of the laser ablated a-Si, in the direction of the high-intensity center of the laser beam spot beginning at the point at which the fluence of the laser beam is sufficiently intense to effect boron transfer despite being displaced from the high-intensity center. Consequently, in one embodiment, between the perimeter of the laser-ablated a-Si region and the perimeter of the boron-doped center region, there is no boron doping from the BSG layer 407 transferred to the underlying polysilicon layer 405.

Figure 4C:
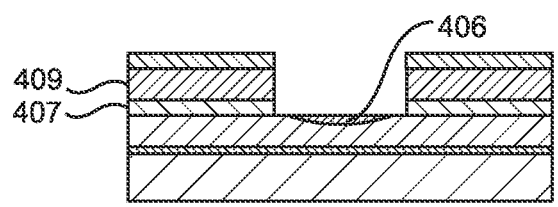

Referring to FIG. 4C, after one or more operations that result in the cross-section shown in FIG. 4B, an HF etch is performed. In one embodiment, the HF etch removes portions of the USG 409 and the BSG 407 layers that are exposed by the opening in the a-Si layer 411.

Figure 4D:
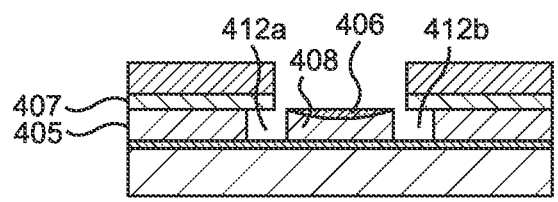

Referring to FIG. 4D, after one or more operations that result in the cross-section shown in FIG. 4C, a KOH etch is performed. In one embodiment, the KOH etches material not masked by the boron doped polysilicon and some material located underneath the BSG layer 407 to form a plurality of polysilicon islands 408 (see FIG. 2B) in the polysilicon layer 405 and undercut regions under the BSG layer 407. In other embodiments, other processes as described herein for forming polysilicon islands 408 in a polysilicon layer such as the polysilicon layer 405 can be used. Referring to FIG. 4D, in one embodiment, trenches 412a and 412b are opposite side cross-sectional parts of a trench that surrounds the polysilicon island 408 associated with the boron doped surface region 406 shown in FIG. 4D.

Figure 4E:
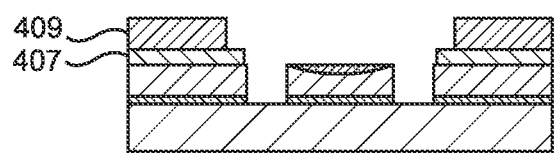

Referring to FIG. 4E, after one or more operations resulting in the cross-section shown in FIG. 4D, an HF etch is performed. In one embodiment, the HF etch etches back the BSG layer 407 and the USG layer 409.

Figure 4F:
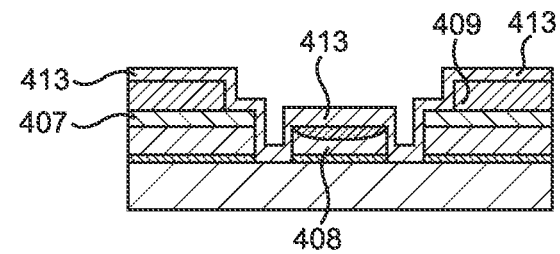

Referring to FIG. 4F, after one or more operations resulting in the cross-section shown in FIG. 4E, the surface of the semiconductor structure 400 is cleaned and a deposition of a PSG layer 413 is performed thereon.

Figure 4G:
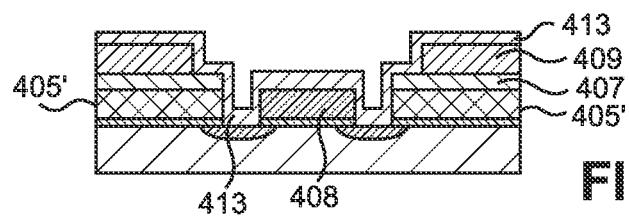

Referring to FIG. 4G, after one or more operations resulting in the cross-section shown in FIG. 4F, a thermal process is performed. In one embodiment, as part of the thermal process phosphorous is caused to diffuse out of the PSG layer 413 or PSG layer stack into the polysilicon islands 408 with boron doped surfaces 406 in a manner that is designed to cause phosphorous dopant overcompensation in the center of the laser ablated region that is initially only boron doped (the polysilicon islands 408 with boron doped surface regions 406). In particular, the diffusion of phosphorous into the polysilicon islands 408 with boron doped surface 406 causes the polysilicon islands 408 to assume the n-type polarity of phosphorous. In addition, in one embodiment, the thermal process causes phosphorous to diffuse out of the portions of the PSG layer 413 or PSG layer stack that are located in the trenches 412*a* and 412*b* that surround the polysilicon islands 408 into areas of the wafer 401 that are located under and around the bottom of the trenches 412*a* and 412*b* that surround the polysilicon islands 408. In particular, the diffusion of phosphorous out of the PSG layer 413 or PSG stack that is located in the trenches 412*a* and 412*b* that surround the polysilicon islands 408, produces n+ doped regions in areas of the wafer 401 that are located under and around the bottom of the trenches 412*a* and 412*b* that surround the polysilicon islands 408. In one embodiment, the plurality of polysilicon islands 408 of n-type polarity can have shapes that include but are not limited to circular, rectangular, elongated, elliptical or irregular. In one embodiment, the thermal process causes a diffusion of p-type dopants from BSG layer 407 into the portions of the polysilicon layer 405 that are located outside of the lasered region to form p-type polysilicon layer 405'.

FIGS. 5A-5G are illustrations of cross-sections of a semiconductor structure 500 during fabrication of a solar cell according to one embodiment. Referring to 5A, a cross-section of multilayer semiconductor structure 500 is shown after initial operations that include depositing a multilayered stack of dielectrics using PECVD or APCVD onto an intrinsic polysilicon layer. In one embodiment, the semiconductor structure 500 includes wafer 501, tunnel oxide layer 503, polysilicon layer 505, BSG layer 507, PSG layer 509, and USG layer 511.

Figure 5A:
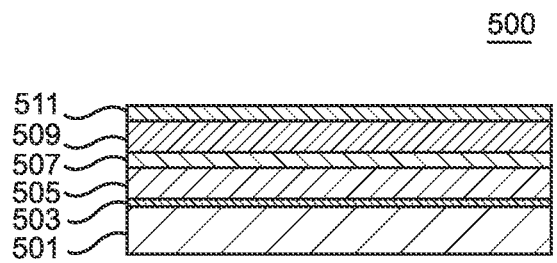
FIGS. 5A-5E are illustrations of cross-sections of a multilayer semiconductor structure during fabrication of a solar cell according to one embodiment.
Figure 5B:
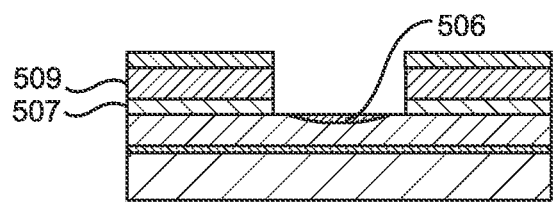

Referring to FIG. 5B, after one or more operations resulting in the cross-section shown in FIG. 5A, a laser ablation process forms openings in the multilayered stack of dielectrics. And, as part of the laser ablation process, boron is transferred from the BSG layer 507 into portions of the surface of the polysilicon layer 505 in the region of laser ablation to form boron-doped surface regions 506. In one embodiment, the laser ablation operation and the boron transfer operation can be executed using a single laser pulse or multiple laser pulses. In one embodiment, the laser ablation operation and the boron transfer operation can be performed by a single laser using a single laser pulse or multiple laser pulses.

In the embodiment of FIGS. 5A-5G, there is no a-Si layer on the stack of dielectric layers that contains the BSG. In this embodiment, in cases where two laser pulses are used, because of the absence of an a-Si layer that can operate to prevent dopant transfer, the first laser pulse can be used to transfer boron into the surface of the polysilicon layer 505, and the second laser pulse can be used to form openings in the multilayered stack of dielectrics.

In one embodiment, both nanosecond and picosecond pulses can be used in the execution of the doping and ablation operations described with reference to FIG. 5B. In one embodiment, an initial non-ablating nanosecond pulse can be fired by the laser to cause the formation of a plurality of boron-doped surface regions 506 in the polysilicon layer 505 before a subsequent picosecond pulse is fired by the laser to ablate the dielectric stack such that a plurality of openings are formed in the dielectric stack in the regions doped with the nanosecond laser.

In one embodiment, the center portion of the laser beam can deliver a higher level of power than other portions of the laser beam. In one embodiment, the higher power delivered by the center portion of the laser beam can cause more efficient boron doping of the polysilicon layer 505 in the center portion of the laser-ablated regions. In contrast, the portions of polysilicon layer 505 nearer the perimeter of the laser-ablated regions may be less-doped or non-doped and thus susceptible to etch by KOH. In addition, as regards beams with flat-top-profiles, in one embodiment, purely thermal effects at the edges (perimeter) of such beams having otherwise flat-top-profiles can result in a less-doped or non-doped perimeter of the laser-ablated regions.

In one embodiment, even if nearly all of a portion of the polysilicon layer 505 that is aligned with an opening in the laser-ablated region is doped by boron, lateral etching can be used to remove portions of the dielectric stack that are located around the perimeter of the opening while leaving in place other portions of the dielectric stack (by stopping the lateral etch at a desired position of the outer wall of the trench to be formed). This process is similar to the lateral etching of dielectrics under an a-Si layer as described herein with reference to FIGS. 3A-3G. However, without the a-Si layer the etchant that creates the lateral etching will not only act on the flanks of the direlectric layer stack around the perimeter of the ablated region, but also act on the surfaces of said stack. Consequently the time for the lateral etching and hence later etch distance is limited by the requirement to leave enough of the dielectric layer stack intact for still fulfilling its two essential functions, which are: (1) to mask the polysilicon under the stack against the (in one embodiment: KOH) etching in the subsequent etch step (apart from some minor lateral under-etching around the perimeter), and (2) to provide a dopant diffusion source during the thermal process after the polysilicon etching. In one embodiment, lateral etching can be performed as part of a cleaning operation that includes HF (performed after the operations described with reference to FIG. 5B are completed) that removes portions of the dielectric stack to expose undoped polysilicon which can be removed by a subsequent KOH etch (for purposes of trench formation). In one embodiment, lateral etching of the stack of dielectric layer can be used in cases where access to the polysilicon that was not doped by boron during the laser processing is not provided by the laser operation(s) of FIG. 5B. This can happen when the laser operation(s) of FIG. 5B results in the doping of nearly all of a surface portion of the polysilicon layer 505 that is aligned with an opening in the laser-ablated region, forming etch resist that masks the underlying polysilicon (in contrast to cases where dopant transfer is concentrated in the central part of the polysilicon located in the laser ablated region and doesn't extend to polysilicon located near the perimeter of the laser ablated region).

Figure 5C:
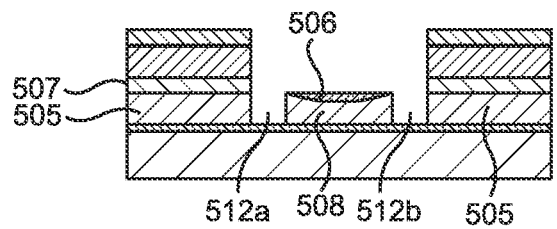

Referring to FIG. 5C, after one or more operations resulting in the cross-section shown in FIG. 5B, a KOH etch is performed. In one embodiment, the boron transferred into portions of the surface of the polysilicon layer 505 in the region of the laser ablation forms regions of etch resist that protect the polysilicon that is located underneath the etch resist. In one embodiment, the KOH etch removes portions of the polysilicon layer 505 that are located in the region of laser ablation that are not protected by the etch resist. In one embodiment, the etching away of the polysilicon that is not masked in the region of laser ablation causes the formation of a plurality of trenches that surround a corresponding plurality polysilicon islands 508 in the region of laser ablation. In one embodiment, referring to FIG. 5C, trenches 512a and 512b are opposite side cross-sectional parts of a trench that surrounds the polysilicon island 508 associated with the boron doped surface region 506 shown in FIG. 5C. In one embodiment, the plurality of polysilicon islands 508 can have perimeters with shapes that include but are not limited to circular, rectangular, elongated, elliptical, and irregular.

Figure 5D:
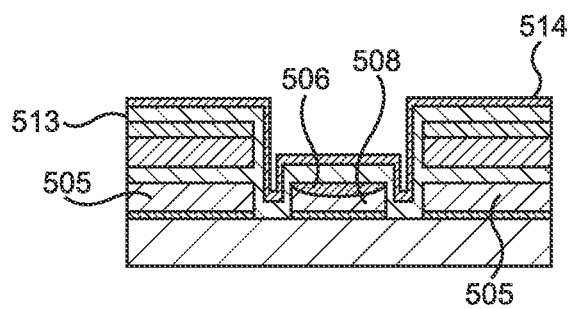

Referring to FIG. 5D, after one or more operations resulting in the cross-section shown in FIG. 5C, cleaning operations and BSG stack 513/514 formation operations are performed. In one embodiment, as a part of this process, BSG 513 is formed on the top surface of the semiconductor structure, in the plurality of trenches 512a and 512b and on the top surface of the corresponding plurality of polysilicon islands 508.

Figure 5E:
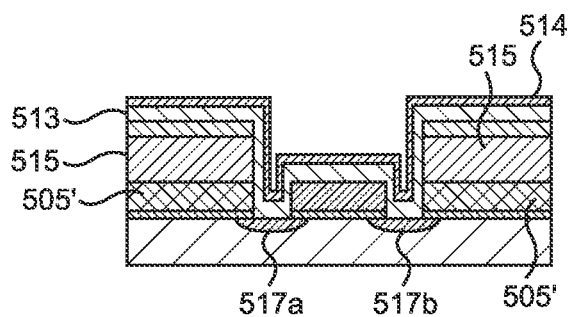

Referring to FIG. 5E, after one or more operations resulting in the cross-section shown in FIG. 5D, a thermal process is performed. In one embodiment, the thermal process can include a furnace process. In one embodiment, as a part of the thermal process, boron can be caused to diffuse from the BSG 513 that is formed on the plurality of polysilicon islands 508 into the polysilicon from which the polysilicon islands 508 are formed. In particular, the diffusion of boron into the polysilicon islands 508 with boron doped surfaces 506 causes the doping of the polysilicon islands 508 such that they have the p-type polarity of the boron. In addition, in one embodiment, the thermal process causes boron to diffuse out of the portions of the BSG 513 or BSG stack that are located in the trenches 512a and 512b that surround the polysilicon islands 508 into areas of the wafer 501 that are located under and around the bottom of the trenches 512a and 512b that surround the polysilicon islands 508. In particular, the diffusion of boron out of the BSG 513 or BSG stack 513/514 that is located in the trenches 512a and 512b that surround the polysilicon islands, produces p+ diffused regions in areas of the wafer 501 that are located under and around the bottom of the trenches 512a and 512b that surround the polysilicon islands 508. In one embodiment, the plurality of polysilicon islands 508 of p-type polarity can have shapes that include but are not limited to circular, rectangular, elongated, elliptical or irregular. In one embodiment, the thermal process causes the PSG layer 509 and the BSG layer 507 to merge to form a BPSG layer 515. In one embodiment, the USG layer 511 may not take part in the fusion of the PSG layer 509 and the BSG layer 507. In one embodiment, the thermal process causes phosphorous to diffuse out of the BPSG layer 515 into parts of the polysilicon layer 505 that are located outside of the laser ablated region to form n-type polysilicon layer 505'.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The various features of different embodiments may be variously combined with some features included and others excluded to suit a variety of different applications.

What is claimed is:

1. A method of forming a solar cell, comprising:
   forming a plurality of openings in a top layer of a multilayered stack of materials;
   forming a plurality of non-contiguous surface doped regions in portions of a polysilicon layer of the multilayered stack of materials that correspond to at least a portion of areas circumscribed by the plurality of openings in the top layer of the multilayered stack of materials;
   forming a plurality of trenches around the plurality of non-contiguous surface doped regions, wherein the non-contiguous surface doped regions act as etch resist; and
   forming a plurality of doped regions in portions of a substrate located under the plurality of trenches.

2. The method of claim 1, wherein the forming the plurality of openings in the top layer of the multilayered stack of materials includes performing a laser ablation process.

3. The method of claim 1, wherein the forming the plurality of non-contiguous surface doped regions in the portions of the polysilicon layer includes performing a non-ablating laser process.

4. The method of claim 1, wherein the forming the plurality of non-contiguous surface doped regions in the portions of the polysilicon layer includes performing a laser ablation process.

5. The method of claim 1, wherein the forming the plurality of non-contiguous surface doped regions in the portions of the polysilicon layer includes causing dopant from a doped insulating layer that is part of the multilayered stack of materials to be transferred into surface portions of the polysilicon layer.

6. The method of claim 1, wherein the forming the plurality of trenches around the plurality of non-contiguous surface doped regions includes forming a plurality of non-contiguous surface doped polysilicon islands.

7. The method of claim 6, further comprising:
   forming a doped insulating layer in the plurality of trenches and on the plurality of non-contiguous surface doped polysilicon islands; and
   executing a thermal process, wherein the thermal process causes dopant to be diffused from the doped insulating layer throughout the plurality of non-contiguous surface doped polysilicon islands.

8. The method of claim 7, wherein the thermal process causes the forming of the plurality of doped regions in the substrate by causing dopant to be diffused from the doped insulating layer.

9. The method of claim 1, wherein the multilayered stack of materials includes a plurality of layers of dielectrics.

10. A method of forming a solar cell, comprising:
    in a single laser process, forming a plurality of openings in a top layer of a multilayered stack of materials and forming a plurality of non-contiguous surface doped regions in portions of a polysilicon layer of the multilayered stack of materials corresponding to the openings;

forming a plurality of trenches around the plurality of non-contiguous surface doped regions wherein the non-contiguous surface doped regions act as etch resist; and forming a plurality of doped regions in a substrate under the trenches around the plurality of non-contiguous surface doped regions.

11. The method of claim 10, wherein the single laser process uses one of a single laser pulse and multiple laser pulses.

12. The method of claim 10, wherein the forming the plurality of non-contiguous surface doped regions in the portions of the polysilicon layer is caused by laser ablation.

13. The method of claim 10, wherein an ablating laser pulse and a non-ablating laser pulse respectively cause the forming of the plurality of openings in the top layer of the multilayered stack of materials and the forming of the plurality of non-contiguous surface doped regions in the portions of the polysilicon layer of the multilayered stack of materials.

14. The method of claim 10, wherein the forming of the plurality of non-contiguous surface doped regions in the portions of the polysilicon layer includes causing dopant from a doped insulating layer to be transferred into surface portions of the polysilicon layer.

15. The method of claim 10, wherein the forming of the plurality of trenches around the plurality of non-contiguous surface doped regions includes forming a plurality of non-contiguous surface doped polysilicon islands.

16. The method of claim 15, further comprising:

forming a doped insulating layer in the plurality of trenches and on the plurality of non-contiguous surface doped polysilicon islands; and executing a thermal process, wherein the thermal process causes dopant to be diffused from the doped insulating layer throughout the plurality of non-contiguous surface doped polysilicon islands.

17. The method of claim 16, wherein the thermal process causes the forming of the plurality of doped regions in the substrate by causing dopant to be diffused from the doped insulating layer.

18. The method of claim 10, wherein the multilayered stack of materials includes a plurality of layers of dielectrics.

* * * * *